(12) United States Patent
Hashimoto et al.

(10) Patent No.: US 8,379,683 B2
(45) Date of Patent: Feb. 19, 2013

(54) QUANTUM CASCADE LASER

(75) Inventors: Jun-ichi Hashimoto, Yokohama (JP); Katsuhisa Tawa, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/442,974

(22) Filed: Apr. 10, 2012

(65) Prior Publication Data

US 2012/0263204 A1 Oct. 18, 2012

(30) Foreign Application Priority Data

Apr. 13, 2011 (JP) ................. 2011-089351

(51) Int. Cl.
*H01S 3/13* (2006.01)
*H01S 3/00* (2006.01)
*H01S 5/00* (2006.01)

(52) U.S. Cl. ............... 372/45.01; 372/29.015; 372/38.07
(58) Field of Classification Search ............. 372/20.015, 372/38.07, 45.01, 45.012, 87
See application file for complete search history.

(56) References Cited

PUBLICATIONS

Gmachl, et al., "High-power $\lambda \approx 8\mu m$ quantum cascade lasers with near optimum performance", Applied Physics Letters, vol. 72, No. 24, Jun. 15, 1998, pp. 3130-3132.

*Primary Examiner* — Armando Rodriguez
(74) *Attorney, Agent, or Firm* — Smith, Gambrell & Russell, LLP

(57) ABSTRACT

A quantum cascade laser includes a substrate having a first surface, a second surface opposite the first surface, and a recess provided in the second surface; a semiconductor region provided on the first surface of the substrate; a ridge portion extending in one direction on the semiconductor region; a first electrode provided along the ridge portion; and a second electrode provided on the second surface of the substrate. Furthermore, the semiconductor region includes a first cladding layer of n-type, a core layer, and a second cladding layer of n-type stacked in that order. The recess is provided at a position corresponding to the ridge portion in the second surface of the substrate, and the second electrode is provided in the recess.

11 Claims, 14 Drawing Sheets

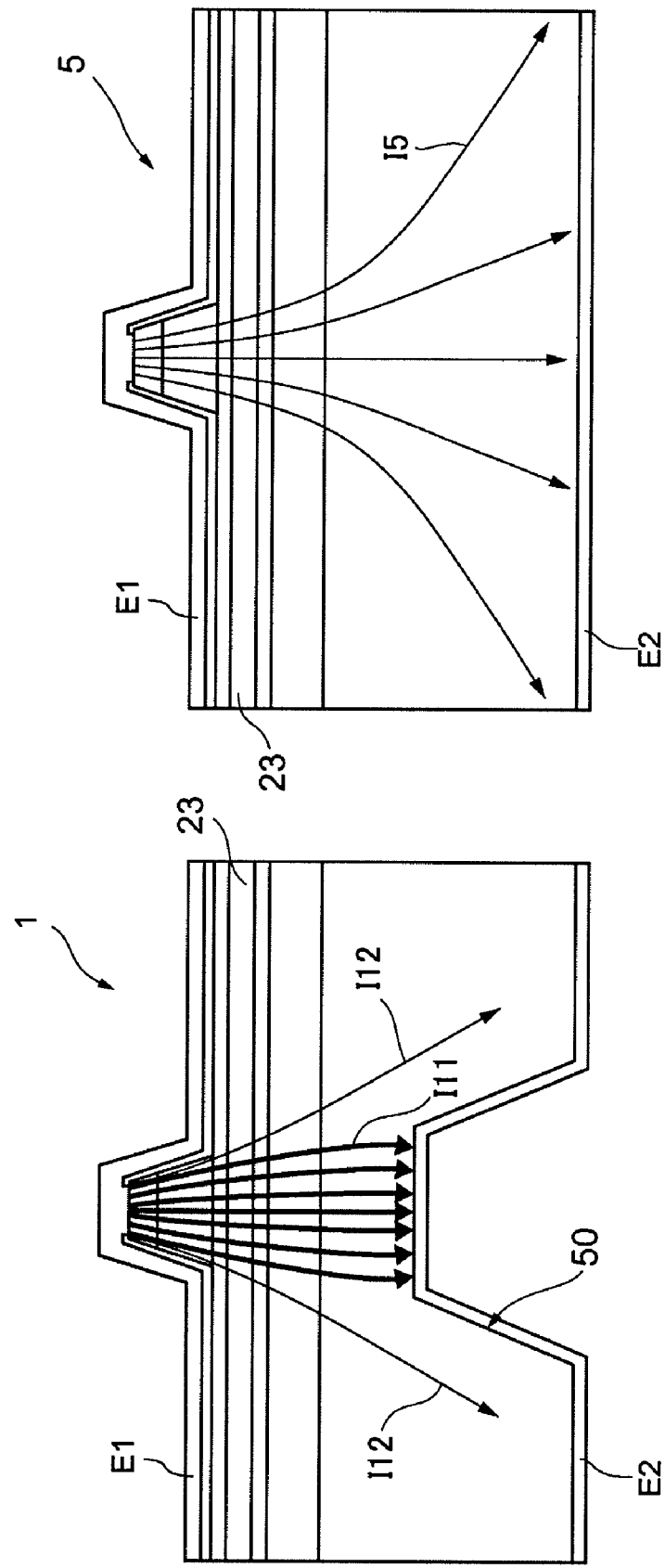

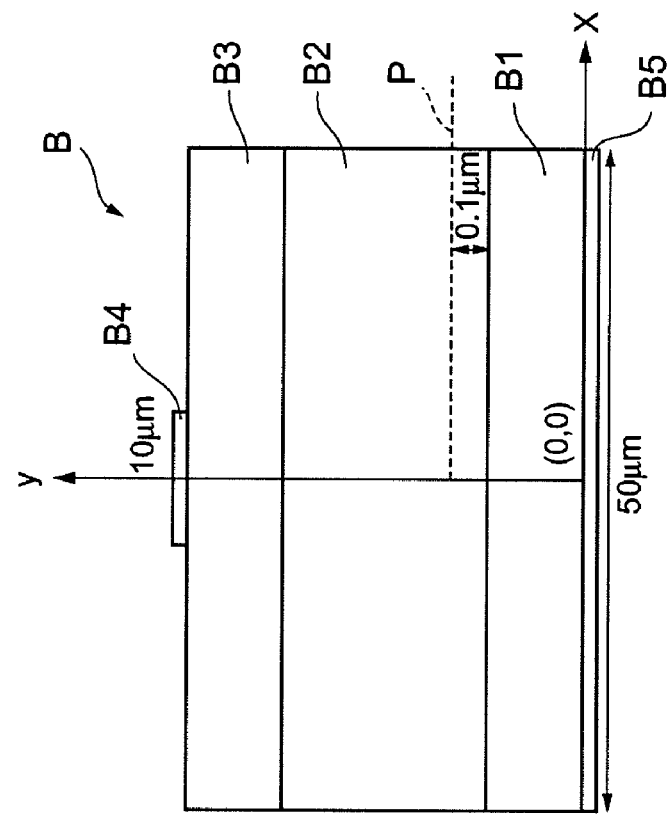
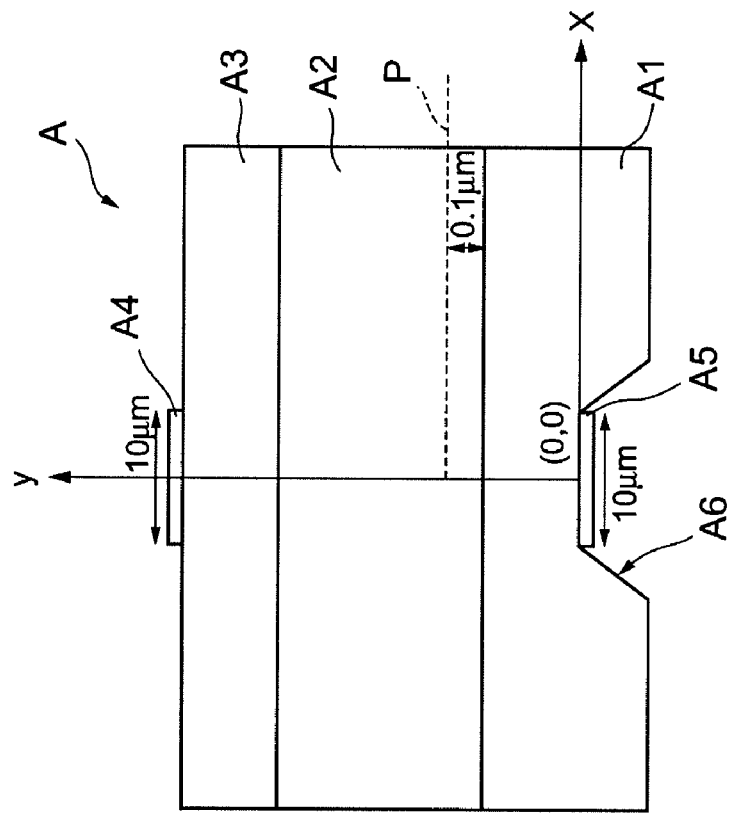

QUANTUM CASCADE LASER

BACKGROUND OF THE INVENTION

1. Field of the Invention

The present invention relates to a quantum cascade laser.

2. Description of the Related Art

Quantum cascade lasers (QCLs) are known as semiconductor optical devices which emit infrared light at an emission wavelength of 2 to 10 μm. Quantum cascade lasers are small-sized, low-cost light sources that can be used in the fields of environmental gas analysis, medical application, industrial processing, and the like. As the current-confinement structure of quantum cascade lasers, for example, a ridge-type waveguide structure described in Non-Patent Document 1 (Applied Physics Letters, vol. 72, pp. 3130-3132, 1998) is known, in which the ridge-type waveguide structure is referred to as a "shallow etched ridge waveguide laser".

SUMMARY OF THE INVENTION

The structure of quantum cascade lasers is designed under the assumption that an electric field is to be applied uniformly to the core layer. However, in a quantum cascade laser having the ridge-type waveguide structure, the electric field applied to the core layer is not uniform because the current (i.e., carriers) spreads in the width direction of the ridge. In this case, resulting from the fact that the electric field applied to the core layer is non-uniform, it may not be possible to obtain the characteristics as designed.

A quantum cascade laser according to the present invention includes (a) a substrate having a first surface, a second surface opposite the first surface, and a recess provided in the second surface, (b) a semiconductor region provided on the first surface of the substrate, (c) a ridge portion extending in one direction on the semiconductor region, (d) a first electrode provided along the ridge portion, and (e) a second electrode provided on the second surface of the substrate. Furthermore, the semiconductor region includes a first cladding layer of a first conductivity type, a core layer, and a second cladding layer of the first conductivity type stacked in that order. The recess is provided at a position corresponding to the ridge portion in the second surface of the substrate, and the second electrode is provided in the recess.

The quantum cascade laser includes the semiconductor region provided on the first surface of the substrate, the ridge portion extending in one direction on the semiconductor region, the first electrode provided along the ridge portion, and the second electrode provided on the second surface of the substrate. Furthermore, the semiconductor region includes the first cladding layer, the core layer, and the second cladding layer stacked in that order, and the first cladding layer and the second cladding layer are composed of semiconductor layers having the same first conductivity type. Moreover, in the quantum cascade laser, the recess is provided in the second surface of the substrate, and the second electrode is provided in the recess. The electrical resistance (hereinafter, referred to as the "resistance") between the first electrode and the second electrode in the portion where the recess is provided is smaller than that in the portion where the recess is not provided. Therefore, when a voltage is applied between the first electrode and the second electrode, the current is concentrated in a portion of the second electrode provided in the recess. Furthermore, the recess is provided at the position corresponding to the ridge portion in the second surface of the substrate. Therefore, it is possible to reduce the amount of current spreading outside a ridge waveguide region defined by the ridge portion, and the percentage of current flowing in the ridge waveguide region can be increased. Consequently, compared with a ridge-type quantum cascade laser in which a recess is not provided on a semiconductor substrate (hereinafter referred to as a "conventional ridge-type QCL"), it is possible to improve the uniformity of the electric field applied to the core layer in the ridge waveguide region.

In the quantum cascade laser of the present invention, preferably, the core layer includes a plurality of active layers and a plurality of injection layers for injecting carriers into the active layers, the active layers being light-emitting regions. In addition, the active layers and the injection layers are alternately stacked. In this quantum cascade laser, it is possible to improve the uniformity of the electric field applied to the core layer in which the active layers and the injection layers are alternately arranged.

In the quantum cascade laser of the present invention, preferably, the recess includes a groove extending in the direction in which the ridge portion extends, and the groove has a bottom with a width that is substantially the same as or less than the width of the ridge portion. In this quantum cascade laser, the resistance between the first electrode and the second electrode in the portion where the bottom of the groove is provided is smaller than that in the portion where the groove is not provided. Therefore, when a voltage is applied between the first electrode and the second electrode, the current is concentrated in a portion of the second electrode provided on the bottom. Thereby, it is possible to further reduce the amount of current spreading outside the ridge waveguide region, and the percentage of current flowing in the ridge waveguide region can be further increased. Consequently, it is possible to further improve the uniformity of the electric field applied to the core layer.

In the quantum cascade laser of the present invention, preferably, the second electrode is provided on the bottom. In this quantum cascade laser, since the second electrode is not provided in regions other than the bottom of the second surface, the resistance outside the ridge waveguide region is larger than the resistance in the ridge waveguide region. Therefore, when a voltage is applied between the first electrode and the second electrode, the current is concentrated in the second electrode provided on the bottom. Thereby, it is possible to further reduce the amount of current spreading outside the ridge waveguide region, and the percentage of current flowing in the ridge waveguide region can be further increased. Consequently, it is possible to further improve the uniformity of the electric field applied to the core layer.

Preferably, the quantum cascade laser of the present invention further includes an insulating layer which is provided between the second surface of the substrate and the second electrode. In addition, the insulating layer has an opening at the position of the recess. The second electrode is directly in contact with the second surface through the opening. In this quantum cascade laser, by providing the insulating layer having the opening at the position of the recess, the second electrode is directly in contact with the second surface at the recess. As a result, the resistance between the first electrode and the second electrode in the portion where the recess is provided is smaller than that in the portion where the recess is not provided. Therefore, when a voltage is applied between the first electrode and the second electrode, the current is concentrated in a portion of the second electrode provided in the recess. Thereby, it is possible to further reduce the amount of current spreading outside the ridge waveguide region, and the percentage of current flowing in the ridge waveguide region can be further increased. Consequently, it is possible to further improve the uniformity of the electric field applied to the core layer.

In the quantum cascade laser of the present invention, preferably, the insulating layer is composed of any one of silicon oxide, silicon nitride, silicon oxynitride, aluminum oxynitride, and aluminum oxide. The dielectric film composed of any of these materials has excellent durability and insulating properties. Therefore, it is possible to increase the resistance in regions other than the ridge waveguide. Furthermore, the dielectric film composed of any of these materials can be easily formed by a sputtering method, chemical vapor deposition (CVD) method, or the like. Consequently, the formation of the dielectric film can be easily incorporated into the manufacturing process.

Preferably, the quantum cascade laser of the present invention further includes a semi-insulating semiconductor layer which is provided between the second surface of the substrate and the second electrode. In addition, the semi-insulating semiconductor layer has an opening at the position of the recess. The second electrode is directly in contact with the second surface through the opening. In this quantum cascade laser, by providing the semi-insulating semiconductor layer having the opening at the position of the recess, the second electrode is directly in contact with the second surface at the recess. As a result, the resistance between the first electrode and the second electrode in the portion where the recess is provided is smaller than that in the portion where the recess is not provided. Therefore, when a voltage is applied between the first electrode and the second electrode, the current is concentrated in a portion of the second electrode provided in the recess. Thereby, it is possible to further reduce the amount of current spreading outside the ridge waveguide region, and the percentage of current flowing in the ridge waveguide region can be further increased. Consequently, it is possible to further improve the uniformity of the electric field applied to the core layer.

In the quantum cascade laser of the present invention, preferably, the semi-insulating semiconductor layer is doped with at least one of protons, Fe, Ti, Cr, and Co. By adding protons and a transition metal, such as Fe, Ti, Cr, or Co, into a III-V group compound semiconductor, such as InP, a high-resistivity semiconductor layer can be obtained. Accordingly, the resistance outside the ridge waveguide region can be increased.

In the quantum cascade laser of the present invention, preferably, the substrate has a first end facet and a second end facet. The recess and the ridge portion each extend in the direction from the first end facet to the second end facet. The recess has a first end and a second end. In addition, the first end and the second end are separated from the first end facet and the second end facet, respectively. In this quantum cascade laser, the recess is not provided in the vicinity of the first end facet and the second end facet of the substrate. As a result, the resistance in the vicinity of the first end facet and the second end facet of the substrate is larger than the resistance at the recess. Therefore, when a voltage is applied between the first electrode and the second electrode, current injection into the ridge waveguide region in the vicinity of the first end facet and the second end facet is suppressed, and thus, the end-facet leakage current can be reduced. Consequently, it is possible to suppress end-facet damage, such as catastrophic optical damage (COD) and electrostatic discharge (ESD). It is also possible to increase the mechanical strength of the device in the vicinity of end facets.

In the quantum cascade laser of the present invention, preferably, the substrate further has a second recess provided in the second surface. In addition, the depth of the second recess is smaller than the depth of the recess. In this quantum cascade laser, by further providing the second recess, heat dissipation efficiency can be improved. Furthermore, since the depth of the second recess is smaller than the depth of the recess, the resistance at the second recess is larger than the resistance at the recess. That is, it is possible to set the resistance outside the ridge waveguide region to be larger than the resistance in the ridge waveguide region. Therefore, when a voltage is applied between the first electrode and the second electrode, the current is concentrated in a portion of the second electrode provided in the recess. Thereby, it is possible to reduce the amount of current spreading outside the ridge waveguide region, and the percentage of current flowing in the ridge waveguide region can be increased. Consequently, it is possible to reduce degradation in characteristics due to heat generation, and it is possible to improve the uniformity of the electric field applied to the core layer.

Furthermore, in the quantum cascade laser of the present invention, preferably, the first conductivity type is n-type.

BRIEF DESCRIPTION OF THE DRAWINGS

FIG. 2A is a schematic view of current paths in the quantum cascade laser shown in FIG. 1, and FIG. 2B is a schematic view of current paths in a conventional quantum cascade laser;

FIG. 3A is a view showing a model of the quantum cascade laser shown in FIG. 1, and FIG. 3B is a view showing a model of the conventional quantum cascade laser;

DESCRIPTION OF THE PREFERRED EMBODIMENTS

Figure 1:
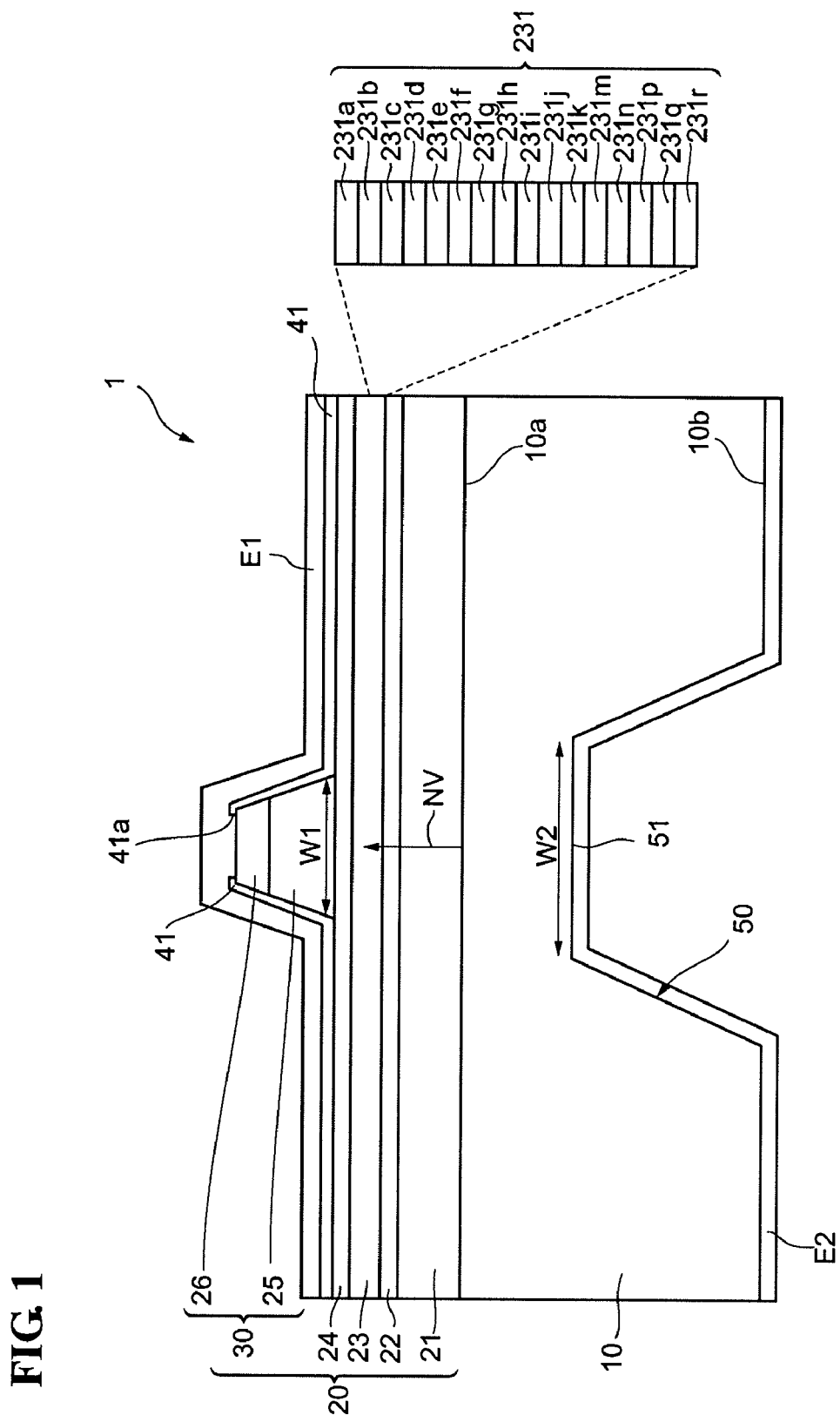
FIG. 1 is a cross-sectional view which schematically shows a quantum cascade laser according to an embodiment of the present invention.

Embodiments of the present invention will be described in detail below with reference to the accompanying drawings. When possible, the same reference numerals are used to indicate the same or corresponding elements.

First Embodiment

FIG. 1 is a view which schematically shows a structure of a quantum cascade laser 1 according to a first embodiment. Specifically, FIG. 1 is a cross-sectional view taken in a direction orthogonal to the extending direction of a ridge of the quantum cascade laser 1. The quantum cascade laser 1 is a ridge-type quantum cascade laser device, and is capable of emitting light in the mid-infrared region with an emission wavelength of about 3 to 20 μ. As shown in FIG. 1, the quantum cascade laser 1 includes a semiconductor substrate (substrate) 10, a semiconductor region 20, an upper electrode (first electrode) E1, and a lower electrode (second electrode) E2. Furthermore, the semiconductor substrate 10 and the semiconductor region 20 have the same, first conductivity type, for example, which can be n-type.

The semiconductor substrate 10 has a principal surface (first surface) 10a and a back surface (second surface) 10b opposite the principal surface 10a. The semiconductor substrate 10 is, for example, composed of n-type InP. The semiconductor substrate 10 preferably has a thickness that enables device formation by cleavage and, for example, a thickness of about 100 to 200 μm. The back surface 10b has a recess 50, which will be described below.

The semiconductor region 20 is a semiconductor epitaxial layer (hereinafter, referred to as the "epitaxial layer") grown on the principal surface 10a of the semiconductor substrate 10 using a crystal growth method, such as a metal-organic vapor phase epitaxy (MOVPE) method or molecular beam epitaxy (MBE) method. The semiconductor region 20 includes a lower cladding layer 21 (first cladding layer), a lower optical confinement layer 22, a core layer 23, an upper optical confinement layer 24, an upper cladding layer 25 (second cladding layer), and a contact layer 26. The lower cladding layer 21, the lower optical confinement layer 22, the core layer 23, the upper optical confinement layer 24, the upper cladding layer 25, and the contact layer 26 are stacked in that order along the normal axis NV of the principal surface 10a of the semiconductor substrate 10. Furthermore, the semiconductor region 20 includes a ridge portion 30.

The lower cladding layer 21 is disposed on the principal surface 10a of the semiconductor substrate 10. The lower cladding layer 21 is, for example, composed of n-type (first conductivity type) InP, and has a thickness, for example, of about 3,000 to 4,000 nm. The lower optical confinement layer 22 is disposed on the lower cladding layer 21. The lower optical confinement layer 22 is, for example, composed of n-type GaInAs, and has a thickness, for example, of about 400 to 500 nm.

The core layer 23 is disposed between the lower optical confinement layer 22 and the upper optical confinement layer 24. The core layer 23 has a cascade structure in which a plurality of active layers and a plurality of injection layers for injecting carriers into the active layers are alternately stacked. In this embodiment, the active layers are light-emitting regions. The active layers and injection layers have a superlattice structure composed of GaInAs and AlInAs. In the core layer 23, for example, a superlattice set in which a first semiconductor layer 231a to a sixteenth semiconductor layer 231r described below are stacked in that order constitutes a unit stacked body 231, and multiple unit stacked bodies 231 are stacked (for example 30 units). An emission of light with a wavelength of about 8 μm is obtained by the core layer 23. In the unit stacked body 231, the eleventh semiconductor layer 231k to the sixteenth semiconductor layer 231r correspond to an active layer, and the first semiconductor layer 231a to the tenth semiconductor layer 231j correspond to an injection layer.

(Example of Structure of Unit Stacked Body 231)

First semiconductor layer 231a: undoped GaInAs, thickness 4.0 nm.

Second semiconductor layer 231b: undoped AlInAs, thickness 1.1 nm.

Third semiconductor layer 231c: n-type GaInAs, thickness 3.6 nm, doping concentration $2 \times 10^{17}$ cm$^{-3}$.

Fourth semiconductor layer 231d: n-type AlInAs, thickness 1.2 nm, doping concentration $2 \times 10^{17}$ cm$^{-3}$.

Fifth semiconductor layer 231e: n-type GaInAs, thickness 3.2 nm, doping concentration $2 \times 10^{17}$ cm$^{-3}$.

Sixth semiconductor layer 231f: undoped AlInAs, thickness 1.2 nm.

Seventh semiconductor layer 231g: undoped GaInAs, thickness 3.0 nm.

Eighth semiconductor layer 231h: undoped AlInAs, thickness 1.6 nm.

Ninth semiconductor layer 231i: undoped GaInAs, thickness 3.0 nm.

Tenth semiconductor layer 231j: undoped AlInAs, thickness 3.8 nm.

Eleventh semiconductor layer 231k: undoped GaInAs, thickness 2.1 nm.

Twelfth semiconductor layer 231m: undoped AlInAs, thickness 1.2 nm.

Thirteenth semiconductor layer 231n: undoped GaInAs, thickness 6.5 nm.

Fourteenth semiconductor layer 231p: undoped AlInAs, thickness 1.2 nm.

Fifteenth semiconductor layer 231q: undoped GaInAs, thickness 5.3 nm.

Sixteenth semiconductor layer 231r: undoped AlInAs, thickness 2.3 nm.

The upper optical confinement layer 24 is disposed on the core layer 23. The upper optical confinement layer 24 is, for example, composed of n-type GaInAs, and has a thickness, for example, of about 400 to 500 nm. The upper cladding layer 25 is disposed on the upper optical confinement layer 24. The upper cladding layer 25 is, for example, composed of n-type (first conductivity type) InP, and has a thickness, for example, of about 3,000 to 4,000 nm. The contact layer 26 is disposed on the upper cladding layer 25. The contact layer 26 is, for example, composed of n-type GaInAs, and has a thickness, for example, of about 100 to 1,000 nm.

The ridge portion 30 includes the upper cladding layer 25 and the contact layer 26. The ridge portion 30 is disposed on the upper optical confinement layer 24. The ridge portion 30 has a predetermined width to confine a current into the core layer 23 and extends in one direction on the upper optical confinement layer 24. The shape of the ridge portion 30 at a cross-section orthogonal to the extending direction of the ridge portion 30 is, for example, trapezoidal. The bottom width W1 of the bottom of the ridge portion 30 is, for example, about 5 to 20 μm. In the semiconductor region 20, the ridge portion 30 constitutes a region that serves as an optical waveguide (hereinafter, referred to as the "ridge waveguide region").

A first insulating layer 41 is disposed on the principal surface of the upper optical confinement layer 24 and the sides of the ridge portion 30. The first insulating layer 41 has a first opening 41a at the upper surface of the ridge portion 30. The first insulating layer 41 is composed of a dielectric film made of silicon oxide (SiO$_2$), silicon nitride (SiN), silicon oxynitride (SiON), aluminum oxynitride (AlON), aluminum oxide (Al$_2$O$_3$), or the like, and has a thickness, for example, of about 300 to 400 nm. An upper electrode E1 is disposed on the first insulating layer 41. In addition, the upper electrode E1 is disposed on the contact layer 26 through the first opening 41a of the first insulating layer 41. The upper electrode E1 is directly in contact with the contact layer 26 through the first opening 41a. The upper electrode E1 is, for example, an ohmic electrode composed of AuGeNi/Au or the like, and has a thickness, for example, of about 3,000 to 5,000 nm.

The recess 50 is provided in the back surface 10b of the semiconductor substrate 10 at a position corresponding to the ridge portion 30 and extends in the extending direction of the ridge portion 30. That is, the recess 50 is provided in the back surface 10b along a plane defined by the normal axis NV of the principal surface 10a and the extending direction of the ridge portion 30. The recess 50 is, for example, a groove, the cross-sectional shape of which orthogonal to the extending direction of the ridge portion 30 is trapezoidal. The recess 50 has a bottom 51, and the width W2 of the bottom 51 is substantially equal to or less than the width W1 of the bottom of the ridge portion 30. The semiconductor substrate 10 at the recess 50 preferably has a thickness that can maintain the mechanical strength of the device and, for example, a thickness of 50 µm or more. Consequently, when the thickness of the semiconductor substrate 10 is 100 µm, the depth of the recess 50 is about 50 µm. Furthermore, preferably, the recess 50 is provided such that, in the cross-section orthogonal to the extending direction of the ridge portion 30, the center line of the bottom 51 corresponds with the center line of the bottom of the ridge portion 30.

A lower electrode E2 is provided on the back surface 10b of the semiconductor substrate 10 including the recess 50. The lower electrode E2 is, for example, an ohmic electrode composed of AuGeNi/Au or the like, and has a thickness, for example, of about 500 to 1,000 nm.

As described above, the ridge waveguide region of the quantum cascade laser 1 has a current-confinement structure in which the sides of the ridge portion 30 and the principal surface of the semiconductor region 20 are covered with the first insulating layer 41. Carriers injected from the upper part of the ridge portion 30 flow through the core layer 23 to the lower electrode E2 provided at the recess 50. Note that in the case where the guided light is sufficiently confined in the core layer 23 without the lower optical confinement layer 22 and the upper optical confinement layer 24, these lower and upper optical confinement layers 22, 24 may be omitted.

A method of manufacturing a quantum cascade laser 1 will be described below. First, a lower cladding layer 21, a lower optical confinement layer 22, a core layer 23, an upper optical confinement layer 24, an upper cladding layer 25, and a contact layer 26 are grown in that order on a principal surface 10a of a semiconductor substrate 10 to form an epitaxial layer. Then, by processing the epitaxial layer, a ridge-type QCL structure is formed on the principal surface 10a side. Specifically, among the epitaxial layer, the contact layer 26 and the upper cladding layer 25 located at both sides of the waveguide region are etched by a wet etching or dry etching process to form a ridge portion 30. Then, a first insulating layer 41 is formed by a sputtering method, CVD method, or the like, on the surface of the epitaxial layer excluding the upper surface of the ridge portion 30. Next, a dielectric mask made of SiO$_2$, SiN, or the like, a resin mask made of a benzocyclobutene (BCB) resin or the like, or a metal mask made of Cr or the like is formed on a region of the back surface 10b of the semiconductor substrate 10 other than the region where a recess 50 is to be formed. The back surface 10b is subjected to selective etching by a dry etching or wet etching process using the mask to form the recess 50. Alternatively, using focused ion beam (FIB), the back surface 10b is bombarded with high-speed ions to grind the region in which the recess 50 is to be formed, and thereby, the recess 50 is formed. As the ions, for example, Ga ions are used. Then, using a sputtering method, electron beam (EB) evaporation method, or the like, a lower electrode E2 is formed. In such a manner, a quantum cascade laser 1 is fabricated. As described above, in the quantum cascade laser 1, crystal growth is performed only once. Furthermore, in the manufacturing process of the quantum cascade laser 1, etching of the active layer is not required. Therefore, crystal degradation due to etching of the active layer does not occur. Consequently, it is possible to manufacture the quantum cascade laser 1 at low cost and high yield.

Figure 4:
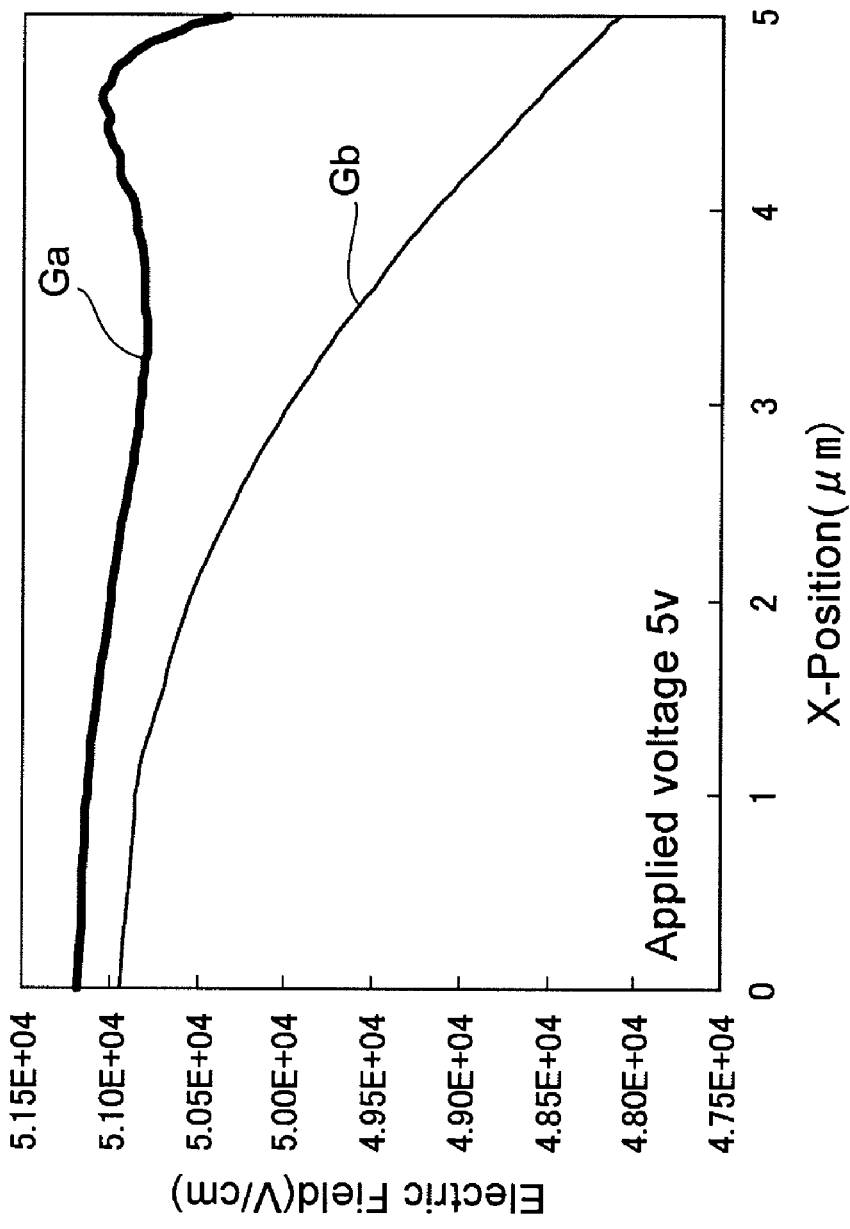
FIG. 4 is a graph showing the results of electric field calculations using a model A shown in FIG. 3A and a model B shown in FIG. 3B.

The operational advantages of the quantum cascade laser 1 will be described below with reference to FIG. 2A to 4. FIG. 2A is a schematic view of current paths in the quantum cascade laser 1. FIG. 2B is a schematic view of current paths in a conventional ridge-type QCL. FIG. 3A is a view showing a model of the quantum cascade laser 1, and FIG. 3B is a view showing a model of the conventional ridge-type QCL. FIG. 4 is a graph showing the results of electric field calculations using the models shown in FIGS. 3A and 3B.

As shown in FIG. 2B, in the conventional ridge-type QCL 5, a voltage is applied between an upper electrode E1 and a lower electrode E2 with the lower electrode E2 being at high potential. In this case, with electrons as carriers, the current I5 spreads outside the ridge waveguide region. Therefore, the electric field applied to the core layer 23 is not uniform. In contrast, in the quantum cascade laser 1 according to this embodiment, the resistance between the upper electrode E1 and the lower electrode E2 in the portion where the recess 50 is provided is smaller than that in the other portion. Therefore, as shown in FIG. 2A, when a voltage is applied between the upper electrode E1 and the lower electrode E2 with the lower electrode E2 being at high potential, the current I11, with electrons as carriers, is concentrated in a portion of the lower electrode E2 provided in the recess 50. That is, the amount of the current I12, with electrons as carriers, spreading outside the ridge waveguide region decreases. On the other hand, the percentage of the current I11, with electrons as carriers, flowing in the ridge waveguide region increases. Consequently, in the quantum cascade laser 1, it is possible to improve the uniformity of the electric field applied to the core layer 23 compared with the conventional ridge-type QCL 5. In this embodiment, since all of the lower cladding layer 21, the lower optical confinement layer 22, the upper optical confinement layer 24, the upper cladding layer 25, and the contact layer 26 included in the semiconductor region formed on the substrate have the n-type as the first conductivity type, only electrons are injected into the quantum cascade laser 1.

With reference to FIGS. 3A to 4, the electric field applied to the core layer of the quantum cascade laser 1 and the electric field applied to the core layer of the conventional ridge-type QCL 5 are compared on the basis of the results of electric field calculations using simplified models. As shown in FIG. 3A, a model A is modeled from a cross-section orthogonal to the extending direction of the ridge of the quantum cascade laser 1. The model A includes a lower layer A1, a core layer A2, an upper layer A3, an upper electrode A4, and a lower electrode A5. A trapezoidal recess A6 is provided in the back surface of the lower layer A1. In the cross-section of FIG. 3A, a width direction of the model A is defined as the X-axis, a height direction of the model A is defined as the Y-axis, and the center in the X-axis direction of the bottom of the recess A6 is defined as the origin (0,0). The lower layer A1 is composed of n-type GaInAs with a doping concentration of $2 \times 10^{17}$ cm$^{-3}$. The thickness of the lower layer A1 at the bottom of the recess A6 is 0.4 μm. The core layer A2 is disposed on the principal surface of the lower layer A1. The core layer A2 is composed of undoped GaInAs and has a thickness of 2.0 μm. The upper layer A3 is disposed on the core layer A2. The upper layer A3 is composed of n-type GaInAs with a doping concentration of $2 \times 10^{17}$ cm$^{-3}$, and has a thickness of 0.4 μm. The upper electrode A4 is disposed on the upper layer A3. The width in the X-axis direction of the upper electrode A4, with the Y-axis being the center, is 10 μm. The lower electrode A5 is disposed on the bottom of the recess A6 formed in the lower layer A1. The width in the X-axis direction of the lower electrode A5, with the Y-axis being the center, is 10 μm. Point P indicates the position at which the electric field intensity is calculated. The point P is a region located 0.1 μm above the principal surface of the lower layer A1 in the Y-axis direction, in which X is 0 or more.

As shown in FIG. 3B, a model B is modeled from a cross-section orthogonal to the extending direction of the ridge of the conventional ridge-type QCL 5. The model B includes a lower layer B1, a core layer B2, an upper layer B3, an upper electrode B4, and a lower electrode B5. In the cross-section of FIG. 3B, a width direction of the model B is defined as the X-axis, a height direction of the model B is defined as the Y-axis, and the center in the X-axis direction of the back surface of the lower layer B1 is defined as the origin (0,0). The lower layer B1 is composed of n-type GaInAs with a doping concentration of $2 \times 10^{17}$ cm$^{-3}$ and has a thickness of 0.4 μm. The core layer B2 is disposed on the principal surface of the lower layer B1. The core layer B2 is composed of undoped GaInAs and has a thickness of 2.0 μm. The upper layer B3 is disposed on the core layer B2. The upper layer B3 is composed of n-type GaInAs with a doping concentration of $2 \times 10^{17}$ cm$^{-3}$, and has a thickness of 0.4 μm. The upper electrode B4 is disposed on the upper layer B3. The width in the X-axis direction of the upper electrode B4, with the Y-axis being the center, is 10 μm. The lower electrode B5 is disposed on the back surface of the lower layer B1. The width in the X-axis direction of the lower electrode B5, with the Y-axis being the center, is 50 μm. Point P indicates the position at which the electric field intensity is calculated. The point P is a region located 0.1 μm above the principal surface of the lower layer B1 in the Y-axis direction, in which X is 0 or more.

In the graph of FIG. 4, the curve Ga indicates the calculation results of the electric field intensity in the Y-axis direction (in the vertical direction) at the point P when a positive voltage is applied to the lower electrode A5 side of the model A shown in FIG. 3A. In the graph of FIG. 4, the curve Gb indicates the calculation results of the electric field intensity in the Y-axis direction (in the vertical direction) at the point P when a positive voltage is applied to the lower electrode B5 side of the model B shown in FIG. 3B. Comparison between the curve Ga and the curve Gb shows that, in the model B, as the X-coordinate value increases, the electric field intensity decreases. In contrast, in the model A, the change in the electric field intensity with the X-coordinate value is small compared with the model B. That is, in the model A, the uniformity of the electric field intensity in the Y-axis direction in the core layer A2 is high compared with the model B. As is clear from the results, in the quantum cascade laser 1, the uniformity of the electric field applied to the core layer 23 can be improved compared with the conventional ridge-type QCL 5. Accordingly, in the quantum cascade laser 1, it is possible to achieve improvement in oscillation characteristics, such as reduction in threshold current and increase in output, compared with the conventional ridge-type QCL.

In the quantum cascade laser 1, the lower electrode E2 is provided over the entire back surface 10b of the semiconductor substrate 10. Consequently, when the quantum cascade laser 1 is subjected to epi-side up mounting, it is possible to perform die bonding by fusing solder on the lower electrode E2 provided on the region excluding the recess 50 of the back surface 10b, thus facilitating epi-side up mounting.

FIRST MODIFICATION EXAMPLE

Figure 5:
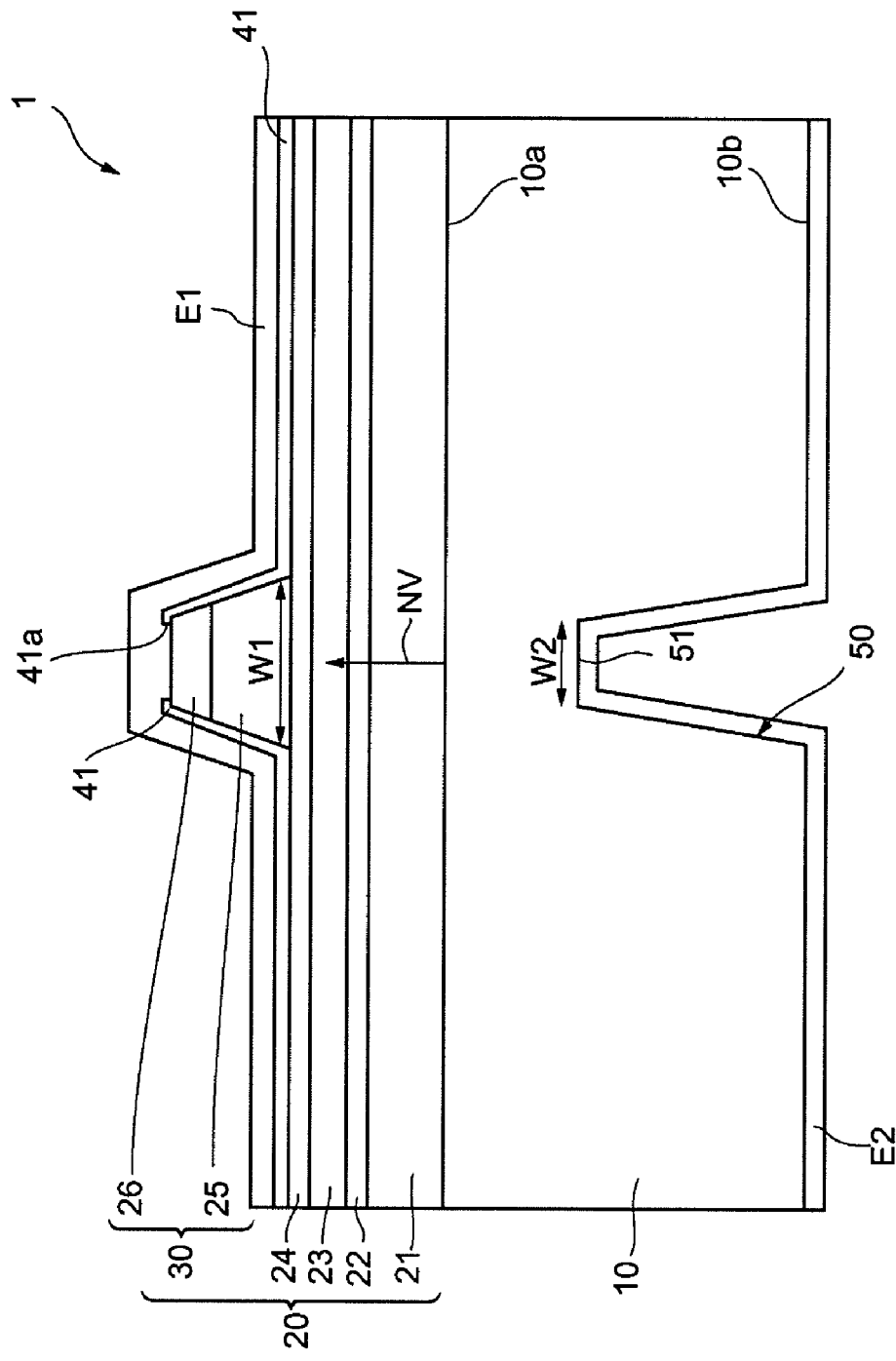
FIG. 5 is a cross-sectional view which schematically shows a structure of a first modification example of the quantum cascade laser shown in FIG. 1.

FIG. 5 is a view which schematically shows a structure of a first modification example of the quantum cascade laser 1 and a cross-sectional view orthogonal to the extending direction of the ridge. A recess 50 is provided in the back surface 10b along a plane defined by the normal axis NV of the principal surface 10a and the extending direction of the ridge portion 30. The width W2 of the bottom 51 of the recess 50 is smaller than the width W1 of the bottom of the ridge portion 30.

According to the first modification example, when a voltage is applied between the upper electrode E1 and the lower electrode E2, the current is concentrated in a portion of the lower electrode E2 provided in the recess 50. Furthermore, since the width W2 of the bottom 51 of the recess 50 is smaller than the width W1 of the bottom of the ridge portion 30, the current can be confined substantially within the ridge waveguide region. Consequently, it is possible to further reduce the amount of current spreading outside the ridge waveguide region. Therefore, it is possible to improve the uniformity of the electric field applied to the core layer 23.

SECOND MODIFICATION EXAMPLE

Figure 6:
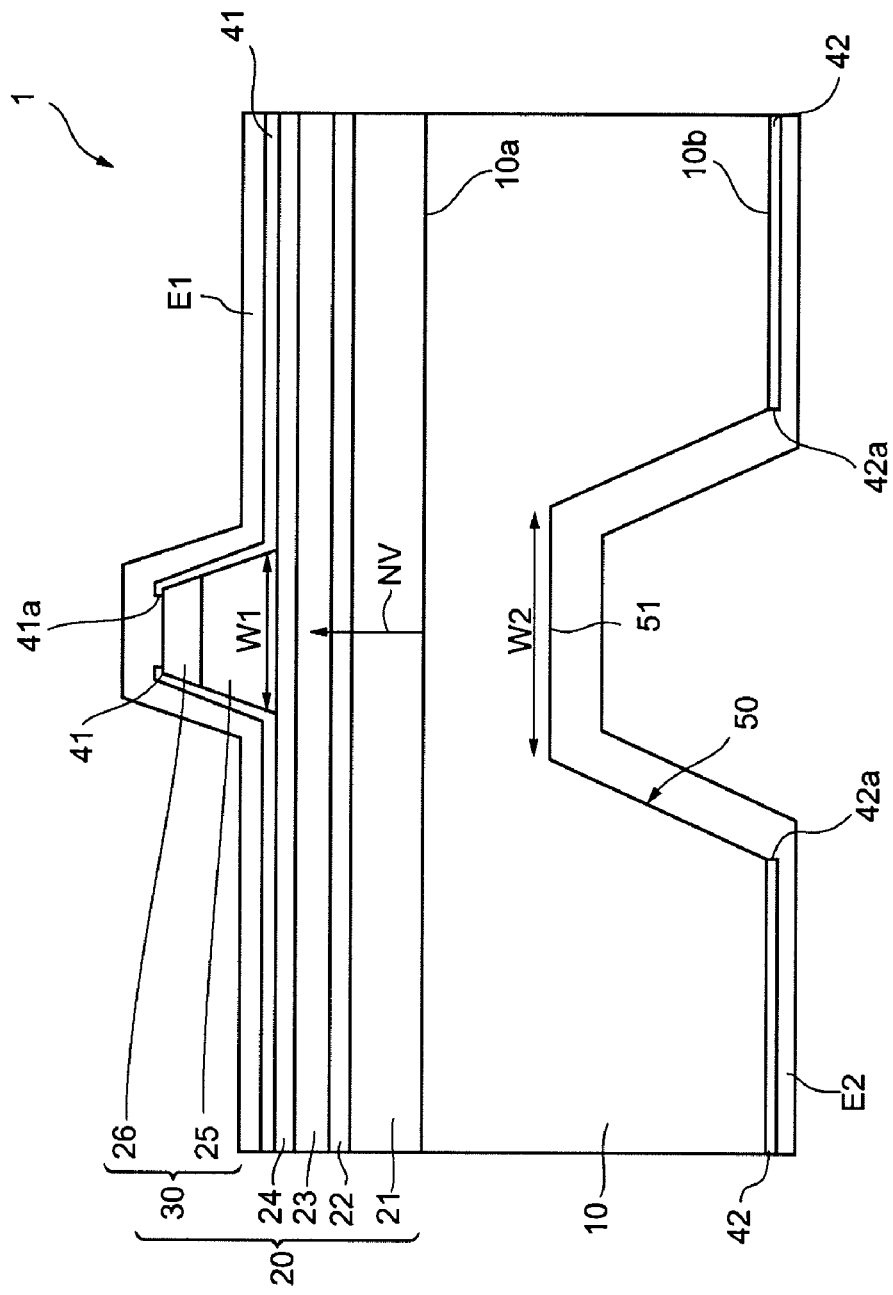
FIG. 6 is a cross-sectional view which schematically shows a structure of a second modification example of the quantum cascade laser shown in FIG. 1.
Figure 7:
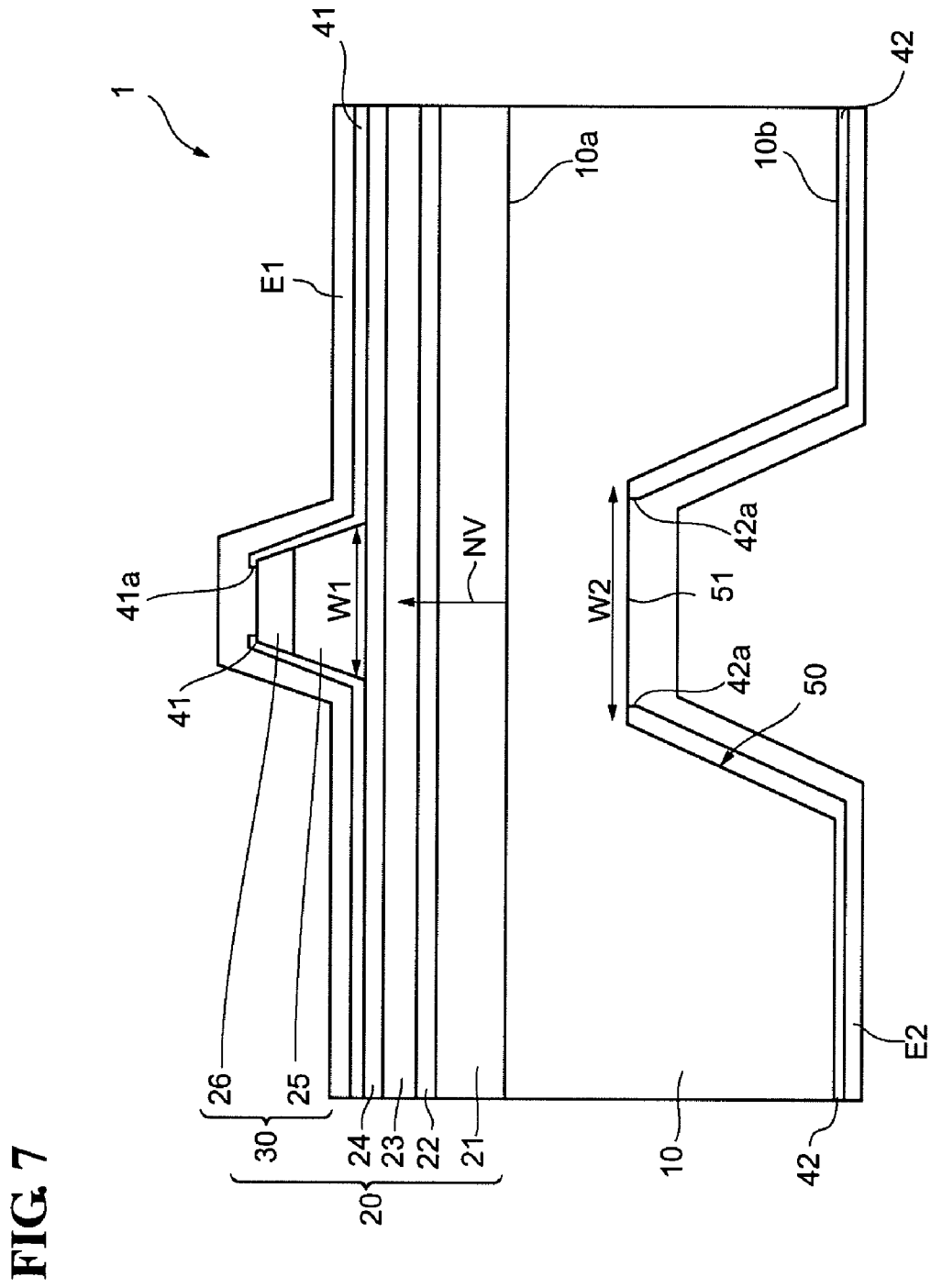
FIG. 7 is a cross-sectional view which schematically shows a structure of a second modification example of the quantum cascade laser shown in FIG. 1.

FIGS. 6 and 7 are each a view which schematically shows a structure of a second modification example of the quantum cascade laser 1 and a cross-sectional view orthogonal to the extending direction of the ridge. In the quantum cascade laser 1 according to the second modification example shown in FIG. 6, a second insulating layer 42 (insulating film) is further provided between the back surface 10b of the semiconductor substrate 10 and the lower electrode E2. The second insulating layer 42 is composed of a dielectric film made of silicon oxide ($SiO_2$), silicon nitride (SiN), silicon oxynitride (SiON), aluminum oxynitride (AlON), aluminum oxide ($Al_2O_3$), or the like, and has a thickness, for example, of about 100 to 500 nm. These dielectric films may be formed by a sputtering method, CVD method, or the like. Furthermore, the second insulating layer 42 has a second opening 42a at the position of the recess 50. The second opening 42a may be provided on the back surface 10b so as to expose the entire recess 50. As shown in FIG. 7, the second opening 42a may be provided at the position corresponding to the ridge waveguide region of the recess 50. When the width W2 of the bottom 51 of the recess 50 is larger than the width W1 of the bottom of the ridge portion 30, the second opening 42a may be provided at the position corresponding to the ridge waveguide region of the bottom 51. The lower electrode E2 is directly in contact with the back surface 10b of the semiconductor substrate 10 through the second opening 42a.

According to the second modification example, by providing the second insulating layer 42 between the back surface 10b and the lower electrode E2 outside the ridge waveguide region, the resistance outside the ridge waveguide region can be further increased. Consequently, it is possible to further reduce the amount of current spreading outside the ridge waveguide region. Accordingly, it is possible to improve the uniformity of the electric field applied to the core layer 23. Therefore, it is possible to further improve the characteristics of the quantum cascade laser 1.

THIRD MODIFICATION EXAMPLE

Figure 8:
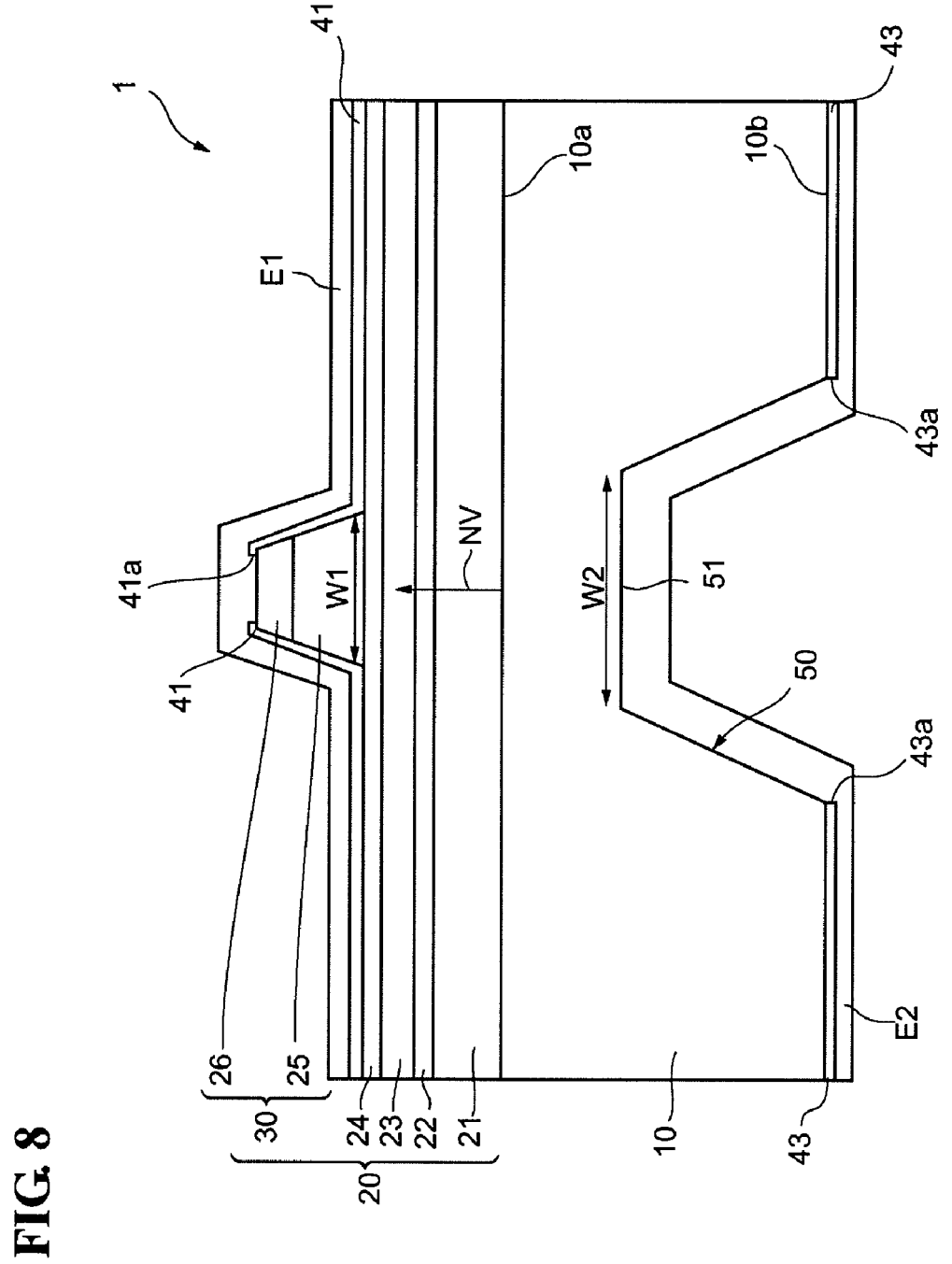
FIG. 8 is a cross-sectional view which schematically shows a structure of a third modification example of the quantum cascade laser shown in FIG. 1.
Figure 9:
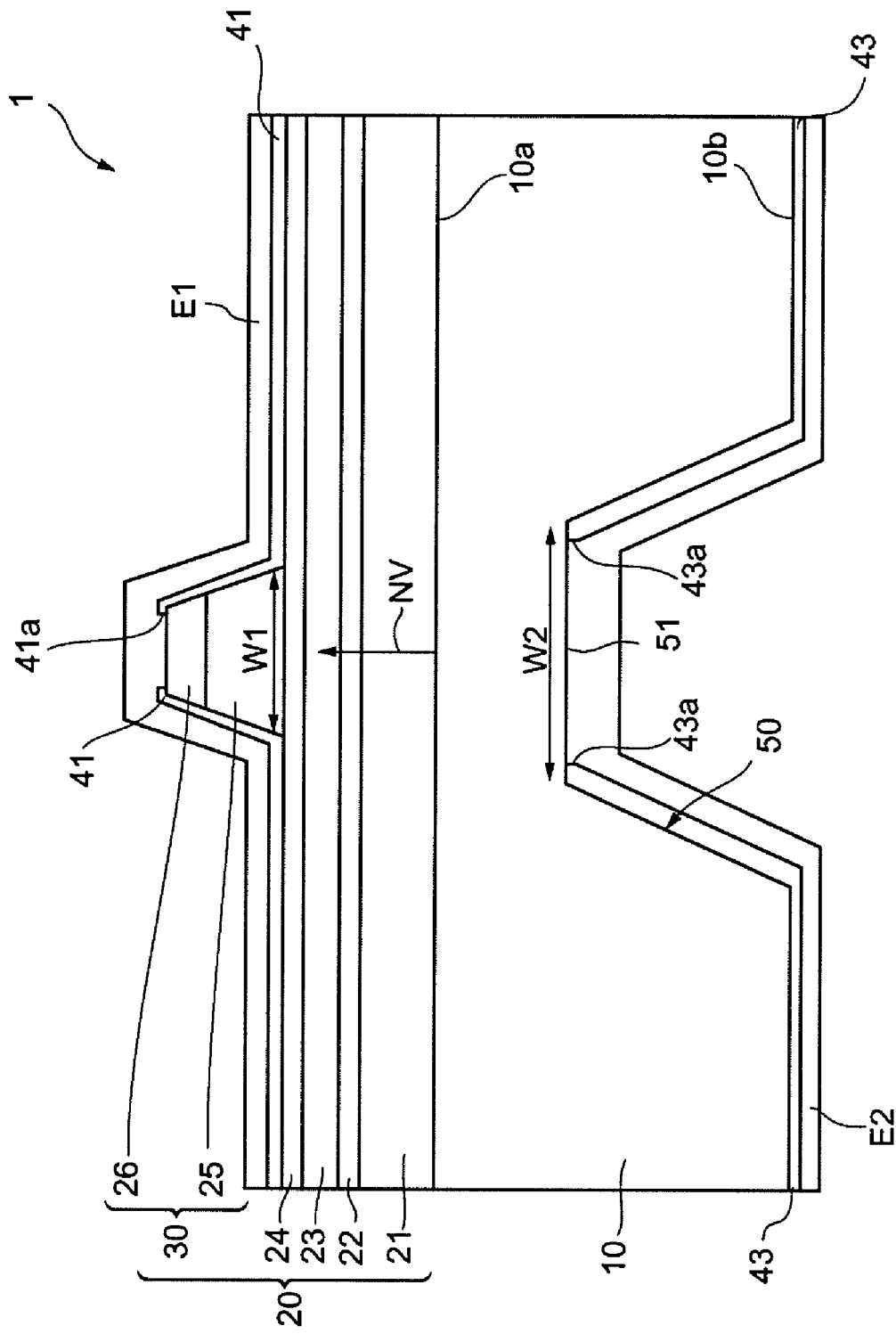
FIG. 9 is a cross-sectional view which schematically shows a structure of a third modification example of the quantum cascade laser shown in FIG. 1.

FIGS. 8 and 9 are each a view which schematically shows a structure of a third modification example of the quantum cascade laser 1 and a cross-sectional view orthogonal to the extending direction of the ridge. In the quantum cascade laser 1 according to the third modification example shown in FIG. 8, a semi-insulating semiconductor layer 43 is further provided between the back surface 10b of the semiconductor substrate 10 and the lower electrode E2. The semi-insulating semiconductor layer 43 can be formed, for example, by injecting protons into an InP semiconductor layer. Alternatively, the semi-insulating semiconductor layer 43 can be composed of an InP semiconductor layer doped with a transition metal, such as Fe, Ti, Cr, or Co. The semi-insulating semiconductor layer 43 has a resistivity of $10^5$ Ωcm or more. The thickness of the semi-insulating semiconductor layer 43 is, for example, about 100 to 1,000 nm. Furthermore, the semi-insulating semiconductor layer 43 has a third opening 43a at the position of the recess 50. The third opening 43a may be provided on the back surface 10b so as to expose the entire recess 50. As shown in FIG. 9, the third opening 43a may be provided at the position corresponding to the ridge waveguide region of the recess 50. When the width W2 of the bottom 51 of the recess 50 is larger than the width W1 of the bottom of the ridge portion 30, the third opening 43a may be provided at the position corresponding to the ridge waveguide region of the bottom 51. The lower electrode E2 is directly in contact with the back surface 10b of the semiconductor substrate 10 through the third opening 43a.

According to the third modification example, by providing the semi-insulating semiconductor layer 43 between the back surface 10b and the lower electrode E2 outside the ridge waveguide region, the resistance outside the ridge waveguide region can be further increased. Consequently, it is possible to further reduce the amount of current spreading outside the ridge waveguide region. Accordingly, it is possible to improve the uniformity of the electric field applied to the core layer 23. Therefore, it is possible to further improve the characteristics of the quantum cascade laser 1. Furthermore, by providing the semi-insulating semiconductor layer 43, adhesion between the lower electrode E2 and the back surface 10b of the semiconductor substrate 10 can be improved. Consequently, when the lower electrode E2 is subjected to die bonding or wire bonding, the die bonding strength, wire bonding strength, or the like can be increased.

FOURTH MODIFICATION EXAMPLE

Figure 10:
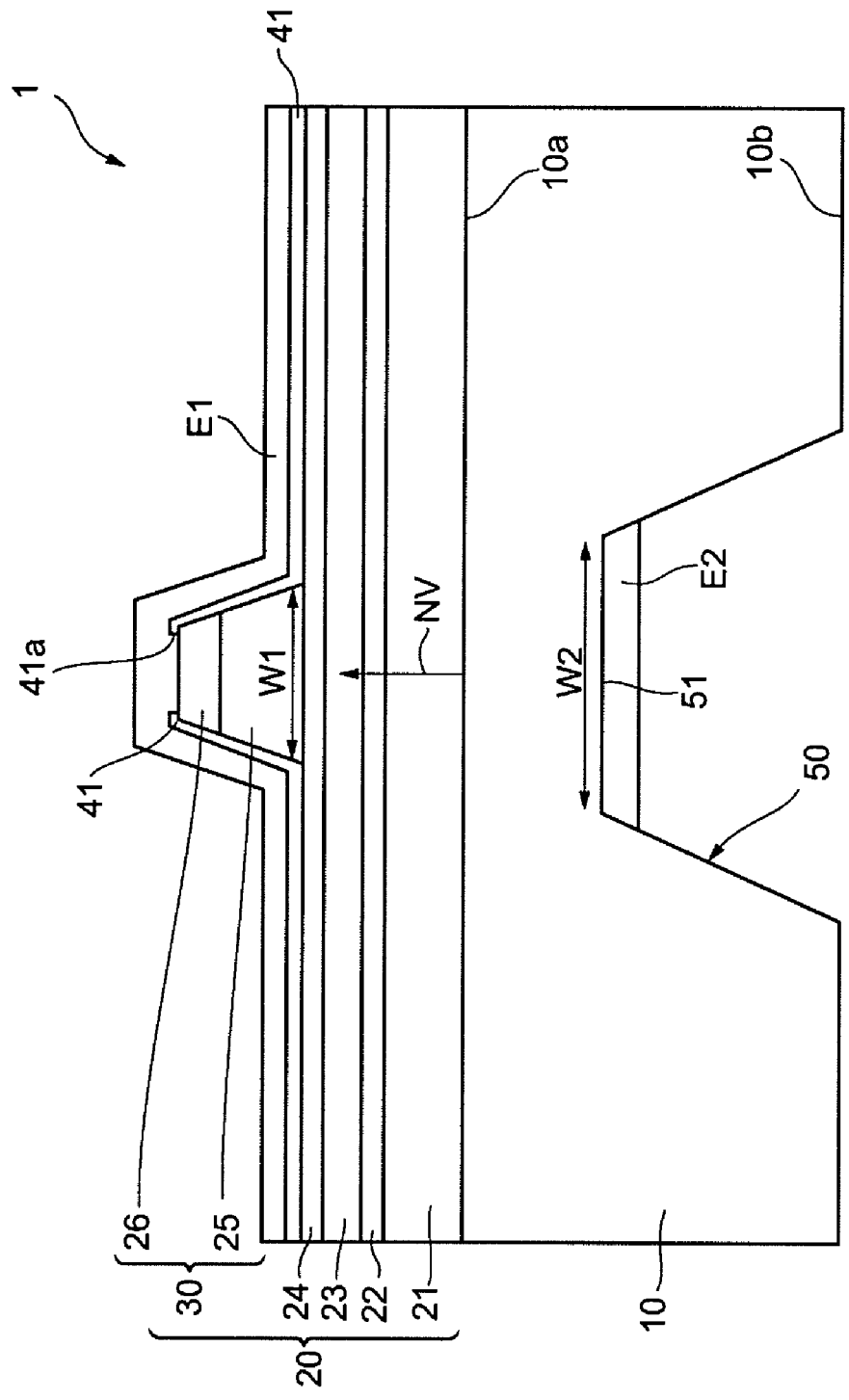
FIG. 10 is a cross-sectional view which schematically shows a structure of a fourth modification example of the quantum cascade laser shown in FIG. 1.
Figure 11:
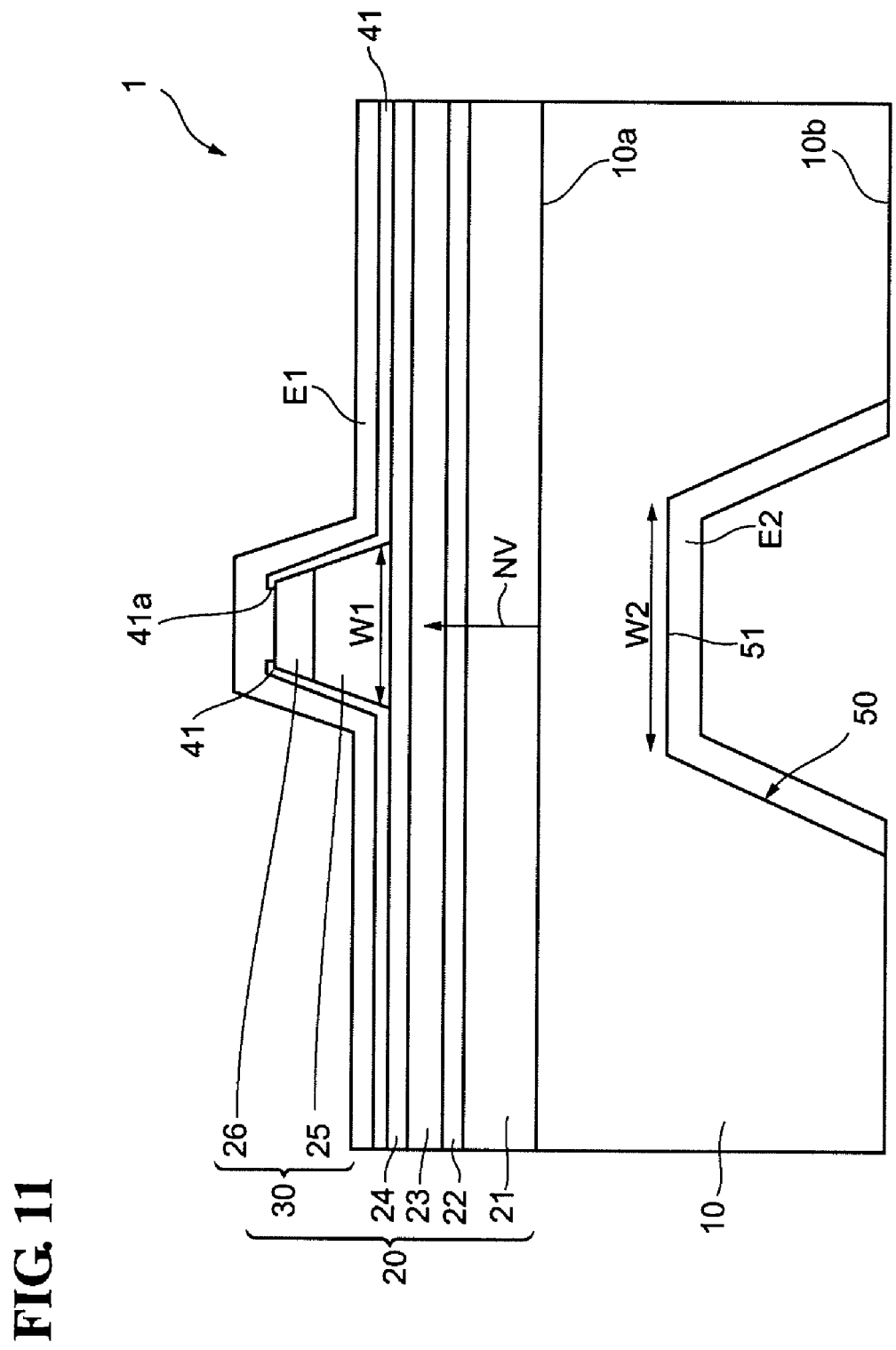
FIG. 11 is a cross-sectional view which schematically shows a structure of a fourth modification example of the quantum cascade laser shown in FIG. 1.

FIGS. 10 and 11 are each a view which schematically shows a structure of a fourth modification example of the quantum cascade laser 1 and a cross-sectional view orthogonal to the extending direction of the ridge. In the quantum cascade laser 1 according to the fourth modification example shown in FIG. 10, the lower electrode E2 is provided only on the bottom 51 of the recess 50. In the quantum cascade laser 1 according to the fourth modification example shown in FIG. 11, the lower electrode E2 is provided over the entire recess 50. In consideration of the width W1 of the bottom of the ridge portion 30 and the width W2 of the bottom 51 of the recess 50, the lower electrode E2 is provided at the position corresponding to the ridge portion 30. In the cross-section orthogonal to the extending direction of the ridge portion 30, the lower electrode E2 is preferably provided on the center line of the bottom of the ridge portion 30. The lower electrode E2 is preferably provided at a width equal to or less than the width W1 of the bottom of the ridge portion 30. Furthermore, the lower electrode E2 is not limited to the lower electrode E2 shown in FIG. 10 or 11, and may be provided on a part of the bottom 51 of the recess 50, or on the entire bottom 51 and parts of the sides of the recess 50.

According to the fourth modification example, since the lower electrode E2 is not disposed in a region other than the recess 50 of the back surface 10b, the resistance outside the ridge waveguide region can be increased relative to the resistance in the ridge waveguide region. Therefore, when a voltage is applied between the upper electrode E1 and the lower electrode E2, the current can be concentrated in the lower electrode E2 provided in the recess 50. It is possible to reduce the amount of current spreading outside the ridge waveguide region, and the percentage of current flowing in the ridge waveguide region can be increased. Accordingly, it is possible to improve the uniformity of the electric field applied to the core layer 23. Therefore, it is possible to further improve the characteristics of the quantum cascade laser 1.

FIFTH MODIFICATION EXAMPLE

Figure 12:
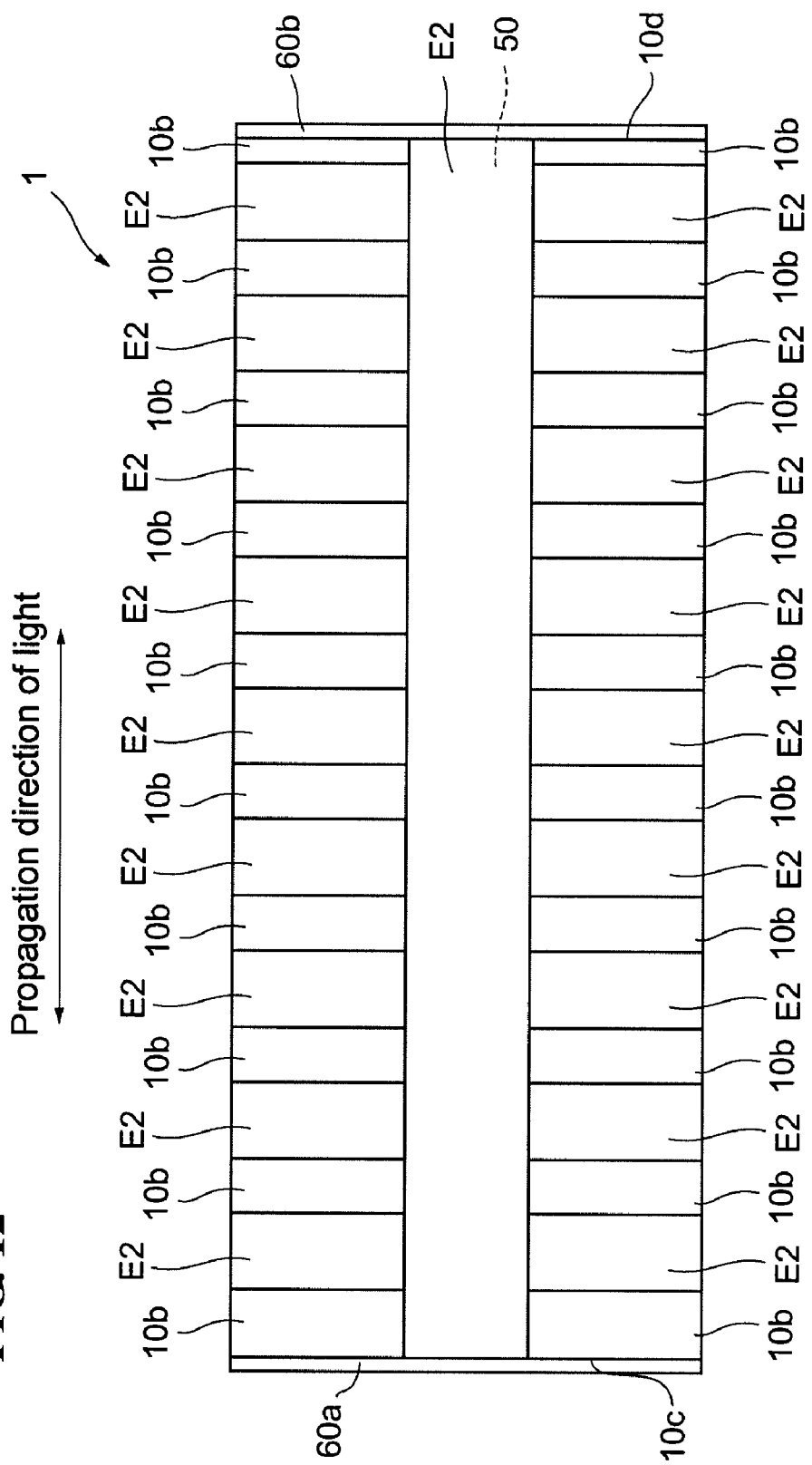
FIG. 12 is a bottom view which schematically shows a structure of a fifth modification example of the quantum cascade laser shown in FIG. 1.

FIG. 12 is a bottom view which schematically shows a structure of a fifth modification example of the quantum cascade laser 1. In the quantum cascade laser 1 according to the fifth modification example shown in FIG. 12, the lower electrode E2 is provided on the entire recess 50 and parts of a region other than the recess 50 of the back surface 10b. A first end facet 10c is an end facet in the extending direction of the ridge portion 30 of the semiconductor substrate 10. A second end facet 10d is another end facet in the extending direction of the ridge portion 30 of the semiconductor substrate 10. The recess 50 and the ridge portion 30 extend from the first end facet 10c to the second end facet 10d. A first reflection film 60a is provided on the first end facet 10c. A first reflection film 60a may be a high reflection coating film. The first reflection film 60a is, for example, composed of a dielectric multilayer film. A second reflection film 60b is provided on the second end facet 10d. A second reflection film 60b may be a high reflection coating film. The second reflection film 60b is, for example, composed of a dielectric multilayer film. In the quantum cascade laser 1, the first end facet 10c having the first reflection film 60a and the second end facet 10d having the second reflection film 60b constitute a laser cavity. The direction in which the laser cavity extends is referred to as the cavity direction (i.e., propagation direction of light). In regions other than the recess 50 of the back surface 10b, for example, portions of the lower electrode E2 are provided with constant intervals in the cavity direction.

According to the fifth modification example, the resistance outside the ridge waveguide region can be increased compared with the structure in which the lower electrode E2 is provided over the entirety of the back surface 10b of the semiconductor substrate 10. Therefore, it is possible to further reduce the amount of current spreading outside the ridge waveguide region. Accordingly, it is possible to improve the uniformity of the electric field applied to the core layer 23, and it is possible to further improve the characteristics of the quantum cascade laser 1. Furthermore, since the lower electrode E2 is provided in regions other than the recess 50, it is possible to perform die bonding by fusing solder on these regions, thus facilitating epi-side up mounting.

SIXTH MODIFICATION EXAMPLE

Figure 13:
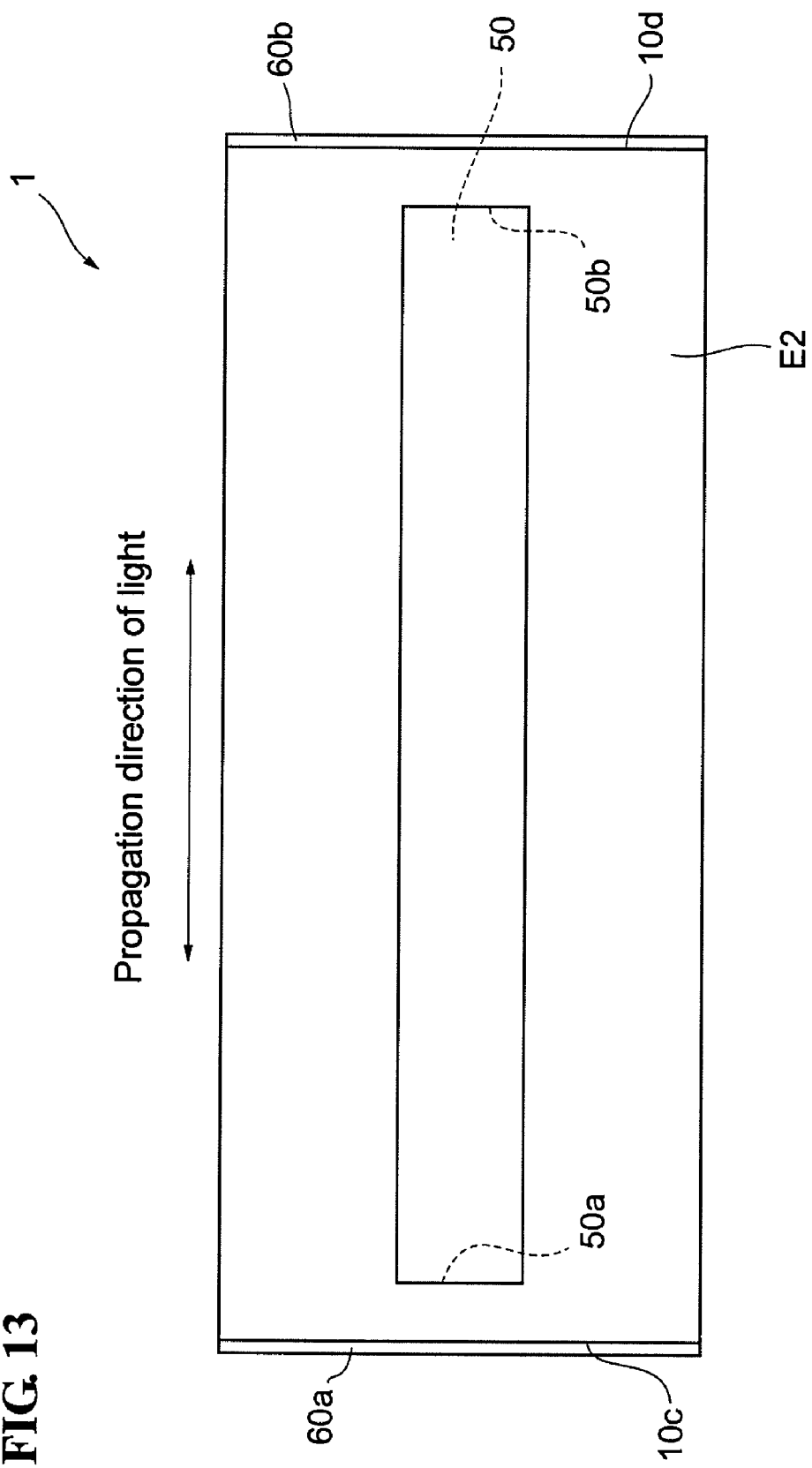
FIG. 13 is a bottom view which schematically shows a structure of a sixth modification example of the quantum cascade laser shown in FIG. 1.

FIG. 13 is a bottom view which schematically shows a structure of a sixth modification example of the quantum cascade laser 1. In the quantum cascade laser 1 according to the sixth modification example shown in FIG. 13, the ridge portion 30 extends from the first end facet 10c to the second end facet 10d. The recess 50 extends from a first end 50a to a second end 50b. The recess 50 has the first end 50a and the second end 50b. The first end 50a and the second end 50b are separated from the first end facet 10c and the second end facet 10d, respectively. Each of the distance from the first end facet 10c to the first end 50a and the distance from the second end facet 10d to the second end 50b may be any distance that can reduce the leakage current at the first end facet 10c and the second end facet 10d, and is, for example, about 20 to 100 μm. That is, the recess 50 does not extend from the first end facet 10c to the second end facet 10d in the back surface 10b of the semiconductor substrate 10 and is not provided between the first end facet 10c and the first end 50a and between the second end facet 10d to the second end 50b.

According to the sixth modification example, since the recess 50 is not provided in the vicinity of the first end facet 10c and the second end facet 10d of the semiconductor substrate 10, the waveguide region in the vicinity of the first end facet 10c and the second end facet 10d has a high resistance compared with the waveguide region in which the recess 50 is provided. Accordingly, the current does not easily flow in the ridge waveguide region in the vicinity of the first end facet 10c and the second end facet 10d. That is, according to the sixth modification example, since current is inhibited from being injected into the ridge waveguide region in the vicinity of the first end facet 10c and the second end facet 10d, it is possible to reduce the end-facet leakage current. Consequently, it is possible to suppress end-facet damage, COD and ESD, caused by the end-facet leakage current. Furthermore, according to the sixth modification example, the mechanical strength of the device can be enhanced compared with the case in which the recess 50 is provided so as to extend from the first end facet 10c to the second end facet 10d.

SEVENTH MODIFICATION EXAMPLE

Figure 14:
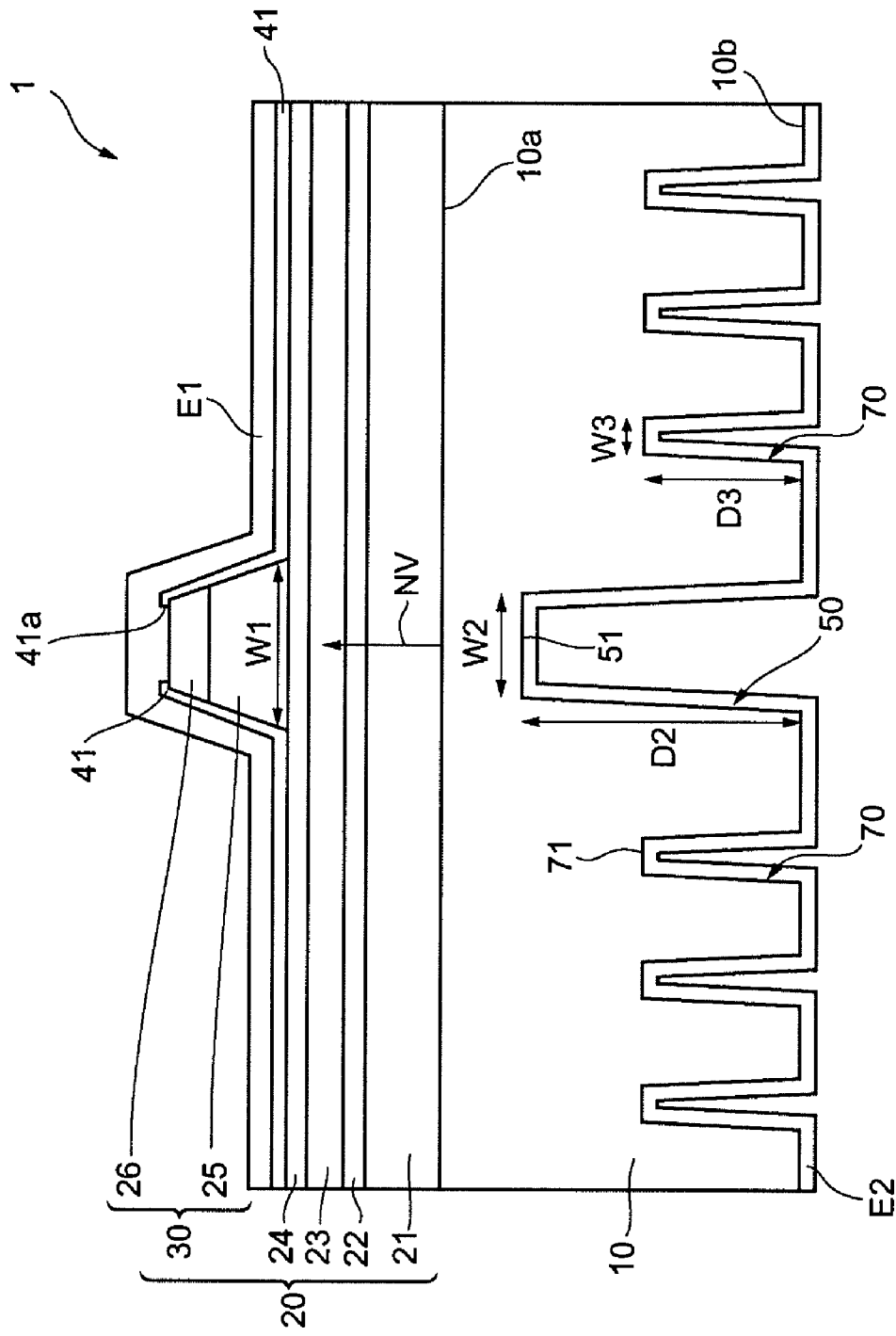
FIG. 14 is a cross-sectional view which schematically shows a structure of a seventh modification example of the quantum cascade laser shown in FIG. 1.

FIG. 14 is a view which schematically shows a structure of a seventh modification example of the quantum cascade laser 1 and a cross-sectional view orthogonal to the extending direction of the ridge. In the quantum cascade laser 1 according to the seventh modification example shown in FIG. 14, one or a plurality of second recesses 70 are further provided in the back surface 10b. The second recesses 70 are provided in the back surface 10b of the semiconductor substrate 10 at portions where the recess 50 is not provided, and extend in the extending direction of the ridge portion 30. Each of the second recesses 70 is, for example, a groove, the cross-sectional shape of which orthogonal to the extending direction of the ridge portion 30 is trapezoidal. The second recess 70 has a bottom 71, and the width W3 of the bottom 71 may be any width that can be provided in a region of the back surface 10b excluding the recess 50. The semiconductor substrate 10 at the second recess 70 preferably has a thickness that can maintain the mechanical strength of the device and, for example, a thickness of 50 μm or more. When the thickness of the semiconductor substrate 10 is, for example, 100 μm, the depth D3 of the second recess is preferably 50 μm or less. Furthermore, in order to improve the uniformity of the electric field in the core layer 23, it is necessary to set the resistance outside the ridge waveguide region to be larger than the resistance in the ridge waveguide region. Consequently, preferably, the depth D3 of the second recess 70 is set to be smaller than the depth D2 of the recess 50. Preferably, the second recess 70 is provided in the vicinity of the ridge waveguide region. Note that the cross-sectional shape of the second recess 70 orthogonal to the extending direction of the ridge portion 30 may be, for example, rectangular, V-shaped, or the like.

A method of manufacturing the quantum cascade laser 1 according to the seventh modification example will be described below. As in the method of manufacturing the quantum cascade laser 1 according to the first embodiment, a ridge-type quantum cascade laser structure is formed on the principal surface 10a side of the semiconductor substrate 10. Next, a dielectric mask made of $SiO_2$, SiN, or the like, a resin mask made of a BCB resin or the like, or a metal mask made of Cr or the like is formed on a region of the back surface 10b of the semiconductor substrate 10 other than regions where a recess 50 and second recesses 70 are to be formed. The regions of the back surface 10b of the semiconductor substrate 10 where the mask is not formed are selectively etched until the depth reaches D3 using a dry etching or wet etching process. The mask used for the etching is removed, and then the dielectric mask or metal mask is formed again on a region other than the region where the recess 50 is to be formed. The region of the back surface 10b of the semiconductor substrate 10 where the mask is not provided is selectively etched until the depth reaches D2. In such a manner, the recess 50 and the second recesses 70 are formed in the back surface 10b of the semiconductor substrate 10.

Alternatively, using focused ion beam, the back surface 10b of the semiconductor substrate 10 may be bombarded with high-speed ions to etch the regions in which the recess 50 and second recesses 70 are to be formed, thereby, forming the recess 50 and the second recesses 70. In the case where focused ion beam is used, it is not necessary to form a mask, and by appropriately changing the ion bombardment time in the formation of the recess 50 and the second recesses 70, the recess 50 and the second recesses 70 can be formed at one time. Then, using a sputtering method, EB evaporation method, or the like, a lower electrode E2 is formed. In such a manner, a quantum cascade laser 1 according to the seventh modification example is fabricated.

According to the seventh modification example, by further providing the second recesses 70 in the back surface 10b, heat dissipation efficiency can be improved. Furthermore, since the depth of the second recesses 70 is smaller than the depth of the recess 50, the resistance outside the ridge waveguide region can be set larger than the resistance in the ridge waveguide region. Accordingly, when a voltage is applied between the upper electrode E1 and the lower electrode E2, the current is concentrated in a portion of the lower electrode E2 provided in the recess 50. Thereby, it is possible to reduce the amount of current spreading outside the ridge waveguide region, and the percentage of current flowing in the ridge waveguide region can be increased. Consequently, it is possible to reduce degradation in characteristics due to heat generation, and it is possible to improve the uniformity of the electric field applied to the core layer 23. Accordingly, the characteristics of the quantum cascade laser 1 can be further improved. In particular, in the ridge waveguide region, since the current flows in a concentrated manner, heat is generated. By providing second recesses 70 in the vicinity of ridge waveguide region, the heat dissipation effect can be enhanced.

The quantum cascade laser according to the present invention is not limited to that in the embodiment described above. For example, in the embodiment, the cross-sectional shape of the recess 50 orthogonal to the extending direction of the ridge portion 30 is trapezoidal. However, the cross-sectional shape is not limited to this and can be any shape. The shape of the recess 50 at a cross-section orthogonal to the extending direction of the ridge portion 30 may be, for example, rectangular, V-shaped, or a shape that does not have the bottom 51. Even in any shape, it is obvious that the same operational advantages as those described in the embodiment can be obtained.

Furthermore, in an InP-based quantum cascade laser, the driving current is about several amperes, and the amount of current spreading outside the ridge waveguide region is large. For this reason, by fabricating an InP-based quantum cascade laser in the embodiment described above, in particular, various oscillation characteristics can be improved.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A quantum cascade laser comprising:
   a substrate having a first surface, a second surface opposite the first surface, and a recess provided in the second surface;
   a semiconductor region provided on the first surface of the substrate;
   a ridge portion extending in one direction on the semiconductor region;
   a first electrode provided along the ridge portion; and
   a second electrode provided on the second surface of the substrate,
   wherein the semiconductor region includes a first cladding layer of a first conductivity type, a core layer, and a second cladding layer of the first conductivity type stacked in that order;
   the recess is provided at a position corresponding to the ridge portion in the second surface of the substrate; and
   the second electrode is provided in the recess.

2. The quantum cascade laser according to claim 1, wherein the core layer includes a plurality of active layers and a plurality of injection layers for injecting carriers into the active layers, the active layers being light-emitting regions, and the active layers and the injection layers are alternately stacked.

3. The quantum cascade laser according to claim 1, wherein the recess includes a groove extending in the direction in which the ridge portion extends, and the groove has a bottom with a width that is substantially the same as or less than the width of the ridge portion.

4. The quantum cascade laser according to claim 3, wherein the second electrode is provided on the bottom.

5. The quantum cascade laser according to claim 1, further comprising:
   an insulating layer which is provided between the second surface of the substrate and the second electrode,
   wherein the insulating layer has an opening at the position of the recess, and the second electrode is directly in contact with the second surface through the opening.

6. The quantum cascade laser according to claim 5, wherein the insulating layer is composed of any one of silicon oxide, silicon nitride, silicon oxynitride, aluminum oxynitride, and aluminum oxide.

7. The quantum cascade laser according to claim 1, further comprising:
   a semi-insulating semiconductor layer which is provided between the second surface of the substrate and the second electrode,
   wherein the semi-insulating semiconductor layer has an opening at the position of the recess, and the second electrode is directly in contact with the second surface through the opening.

8. The quantum cascade laser according to claim 7, wherein the semi-insulating semiconductor layer is doped with at least one of protons, Fe, Ti, Cr, and Co.

9. The quantum cascade laser according to claim 1, wherein the substrate has a first end facet and a second end facet,
   the recess and the ridge portion each extend in the direction from the first end facet to the second end facet,
   the recess has a first end and a second end, and
   the first end and the second end are separated from the first end facet and the second end facet, respectively.

10. The quantum cascade laser according to claim 1, wherein the substrate further has a second recess provided in the second surface, and
    the depth of the second recess is smaller than the depth of the recess.

11. The quantum cascade laser according to claim 1, wherein the first conductivity type is n-type.

* * * * *